(12) United States Patent
Duan et al.

(10) Patent No.: US 7,173,415 B1
(45) Date of Patent: Feb. 6, 2007

(54) SYSTEM, METHOD, AND APPARATUS FOR DETECTING SIGNAL-TO-NOISE RATIO DECAY IN PERPENDICULAR MAGNETIC RECORDING

(75) Inventors: Shanlin Duan, Fremont, CA (US); Jizhong He, San Jose, CA (US); Zhupei Shi, San Jose, CA (US); Jane Jie Zhang, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 9 days.

(21) Appl. No.: 11/189,594

(22) Filed: Jul. 26, 2005

(51) Int. Cl.
*G01R 33/12* (2006.01)
(52) U.S. Cl. .................................. 324/212
(58) Field of Classification Search ............... 324/212; 360/25, 31
See application file for complete search history.

(56) References Cited

U.S. PATENT DOCUMENTS

| | | | |
|---|---|---|---|
| 6,147,488 A | 11/2000 | Bamba et al. | |
| 6,307,817 B1 | 10/2001 | Tsuboi | |
| 6,359,744 B1 | 3/2002 | Mallary | |
| 6,483,300 B1 | 11/2002 | Severson et al. | |
| 6,570,378 B2 | 5/2003 | Goh et al. | |
| 6,603,617 B1 | 8/2003 | Cross | |
| 6,630,824 B2 | 10/2003 | Richter | |
| 6,697,203 B1 | 2/2004 | Cheng et al. | |
| 6,714,368 B1 | 3/2004 | Himle et al. | |
| 2002/0063559 A1 | 5/2002 | Richter | |
| 2003/0016461 A1 | 1/2003 | Seng et al. | |
| 2003/0067697 A1 | 4/2003 | Weinstein et al. | |
| 2003/0132747 A1 | 7/2003 | Hong et al. | |

OTHER PUBLICATIONS

Wenzhong Zhu; Hong Zhou; Jack Judy, and Dean Palmer, "An Experimental Study of the Effect of Thermal Decay on Noise and Nonlinear Distortions in Perpendicular Media", IEEE Transactions on Magnetics, vol. 40, No. 4, Jul. 2004.

Bill E. Higgins and Bruce C. Schardt, "A Fast, Accurate, and Reproducible In-Drive Measurement of Media Thermal Decay", IEEE Transactions on Magnetics, vol. 40, No. 1, Jan. 2004.

Zhen Jin, Hiroshi Ide, Hong Zhou, Peng Luo, and Neal Bertram, "A Model for Bit Error Rate Degradation During Media Thermal Decay", IEEE Transactions on Magnetics, vol. 37, No. 4, Jul. 2001.

(Continued)

*Primary Examiner*—Edward Lefkowitz
*Assistant Examiner*—David M. Schindler
(74) *Attorney, Agent, or Firm*—Bracewell & Giuliani LLP

(57) ABSTRACT

A magnetic test module runs on a spin stand to detect amplitude decay and noise evolution at the same time. Signal-to-noise ratio (SNR) decay is directly measured. The recording performance is correlated better with SNR instead of signal only. The thermal stability of the system is evaluated more accurately with this SNR decay method. A heater is placed under the media disk, and a remote sensing thermometer and temperature controller form a subsystem to set up desired environmental temperature. The heater creates a heated band and the read/write head flies above the heated band. The temperature control system may be removed when SNR decay measurement is performed under room temperature.

17 Claims, 9 Drawing Sheets

OTHER PUBLICATIONS

Ning Li, Forrest Meyer, and Brian Zak, "Drive Level Media Thermal Stability Test", IEEE Transactions on Magnetics, vol. 37, No. 4, Jul. 2001.

Rick C. Shi, Jian-Gang Zhu, Brij B. Lal, Sudhir S. Malhotra, Marilee Schultz, and Michael A. Russak, "Spin-Stand Characterization of Thermal Stability in High Density Disk Media", IEEE Transactions on Magnetics, vol. 36, No. 5, Sep. 2000.

T. C. Arnoldussen, M. Mirzamaani, M. Doerner, K. Tang, X. Bian, J. Feng and M. Gatherwright, "Correlation of Thermal Stability and Signal-to-Noise Ratio of Thin Film Recording Media", IEEE Transactions on Magnetics, vol. 36, No. 1, Jan. 2000.

P. Dhagat, R. S. Indeck and M. W. Muller, "Spin-Stand Measurements of Time and Temperature Dependence of Magnetic Recordings", Journal of Applied Physics, vol. 85, No. 8, Apr. 15, 1999.

Yuzuru Hosoe, Tetsuya Kanbe, Kiwamu Tanahashi, Ichiro Tamai, Satoshi, and Yoshio Takahashi, "Thermal Aftereffects in Thin Film Magnetic Recording Media", IEEE Transactions on Magnetics, vol. 34, No. 4, Jul. 1998.

Hiroyuki Uwazumi, Jinghuan Chen and Jack H. Judy, "Time Decay of Remanent Magnetization, Remanent Coercivity, and Readback Signal of Ultra-thin Longitudinal $CoCr_{12}Ta_2/Cr$ Thin Film Media", IEEE Transactions on Magnetics, vol. 33, No. 5, Sep. 1997.

Thermal Decay [Zone1;Setup1]

DECAY SETUP

SNR

Device Setup
- ☐ RPM  [7200]
- ☐ Track  [10500]
- ☐ Skew  [0]
- ☐ Sector #  [18]
- ☐ Wrt Current  [45.]

Head Disk Info
- ☐ Head type, serial number, bias setting
  [Head Information ▶]
- ☐ Temperature
  ○ Room Temp  ○ User defined
  ○ Elevated Temp  [          ]
- ☐ Disk ID  [PMR Media ID]

Spectrum and Noise Decay
- ☐ Data Rate:
- ☐ From (MHz)  [100]
- ☐ To    (MHz)  [110]
- ☐ Nr of Mrs  [1]
- ☐ Start time  [100]
- ☐ End time  [2900]
- ☐ Nr of Pnts  [0]
- ☐ Nr of Repeat  [7]

Test Radius:  KFCI:
[@ 1.01 in]  [131-145]

Expected elapse of time:
[Time to go:    7 hour:14min]

[SAVE]  [RESET]  [CLOSE]

~51

SYSTEM, METHOD, AND APPARATUS FOR DETECTING SIGNAL-TO-NOISE RATIO DECAY IN PERPENDICULAR MAGNETIC RECORDING

BACKGROUND OF THE INVENTION

1. Technical Field

The present invention relates in general to perpendicular magnetic recording in disk drives and, in particular, to an improved system, method, and apparatus for detecting signal-to-noise ratio decay in perpendicular magnetic recording.

2. Description of the Related Art

Thermal decay due to the "superparamagnetic effect" in longitudinal magnetic recording is becoming a significant concern as the rate of areal density increases rapidly. In the past, substantial effort was devoted to characterizing media thermal decay and understanding the impact of media decay on the ultimate recording performance. Precise and quantitative prediction of media thermal decay lifetime was commonly believed to be an important task. In the prior art, amplitude or magnetization versus time was measured, then the decay rate was determined in percentage decrease per decade of log(time).

Perpendicular magnetic recording (PMR) has been investigated as a way to extend beyond the "superparamagnetic limit" of conventional longitudinal recording. Hard disk drive (HDD) companies are intensively engaged in PMR development. Generic architectures of longitudinal recording 11 and perpendicular recording 13 are depicted in FIG. 1. An important feature of PMR is the "deep gap field" generated by the single pole writer and the soft magnetic underlayer (SUL) in the recording media. However, there are two concerns with PMR. The demagnetization field is generally larger in the PMR, which may induce an increase in background noise over time. Secondly, the SUL is part of the writer during the writing process, but is embedded in the PMR media. SUL is a soft magnetic material (e.g., NiFe permealloy) and easily forms a variety of complex domain structures. The domain movement over time and temperature in the SUL may generate adverse noise evolution. The characterization of these noise dynamics is important to successfully launch PMR HDD products.

The article, *An Experimental Study of the Effect of Thermal Decay on Noise and Nonlinear Distortions in Perpendicular Media*, by W. Zhu, H. Zhou, and J. Judy (IEEE Magn. 40, No. 4, p. 2610–2612 (2004)), provides details of writing a pseudo-random sequence on perpendicular magnetic media and using an oscilloscope to monitor nonlinear distortion and its related noise background for addressing SNR decay. That method was employed in longitudinal magnetic recording in the past and, thus, is merely an example of applying the same method to perpendicular media without any improvements. Unfortunately, that method cannot be implemented in any PMR disk media manufacture testing or at an early stage of PMR media development due to its complexity, the difficulty of capturing very small signal distortion signals, and the difficulty of accurately monitoring an evolution of small distortion as a function of time.

U.S. Patent Application No. 2003/0016461, provides a method of determining a time domain equalized, signal-to-total distortion ratio and an equalized signal-to-noise ratio via writing a pseudo-random 127-bit pattern on a magnetic media. That disclosure determines thermal characterization in HDDs and is not applicable to component level testing, such as magnetic disk media screening. It also requires a channel IC chip for waveform equalization, and needs several specific analog-to-digital conversion (ADC) and digital-to-analog conversion (DAC) units for manipulation. It is impossible to implement that design on conventional spin stand magnetic testers. Thus, one skilled in the art would not employ that prior art method for routine PMR disk media testing and screening. Finally, U.S. Pat. No. 6,630,824, and U.S. Patent Application No. 2002/0063559, provide performance evaluation methods for signal decay, but not SNR decay.

Thus, although the prior art measures signal decay in magnetic recording systems, it is unable to analyze the noise-induced instability in PMR systems. It would be desirable to develop a comprehensive method to resolve this issue. In the present disclosure, a solution is presented for detecting signal decay and noise evolution at the same time.

SUMMARY OF THE INVENTION

In one embodiment of the present invention, a magnetic test module runs on a spin stand to detect amplitude decay and noise evolution at the same time so that signal-to-noise ratio (SNR) decay can be directly measured. The PMR recording performance, such as BER (bit error rate), is correlated better with SNR instead of signal only. The thermal stability of the PMR system is evaluated more accurately with this SNR decay method. Thus, in one embodiment, the present invention discloses a method of detecting SNR decay, while the prior art only detects signal decay.

The SNR decay is integrated into a spin stand for magnetic testing. One embodiment includes a heater located under the media disk, a remote sensing thermometer, and a temperature controller that work as a subsystem to establish a desired environmental temperature. The heater creates a heated band in a disk while the read/write head flies above the heated band. The temperature control system may be removed when SNR decay measurement is performed under room temperature.

Media that may exhibit a significant amount of signal decay after several years of recording are not practically useful. The HDD product media that would exhibit little signal decay after several years of recording would likely exhibit almost negligible signal decay for a reasonably short period after recording. It poses a challenge to reliably measure extremely small changes of the recorded signals because of thermal drift and sensitivity changes of the transducer of the recording head.

In one embodiment, the aged signal and test signal are interleaved on the same written track. Write gate and read gate features are used to control the sequence of aged magnetic bits and test magnetic bits. The aged magnetic bits also act as a reference signal to eliminate the adverse effects of thermal drift and sensitivity change mentioned above.

A SNR decay module was developed to operate decay measurement on a spin stand. For example, SNR decay is integrated into the operation system of one type of spin stand tester. In the SNR decay module, a mechanism of separating aged signal and test signal is illustrated in terms of data processing. As discussed above, the combined result of thermal drift and sensitivity change leads to an undesirable fluctuation in the measured aged signal and test signal. Such fluctuation can be effectively eliminated by taking the ratio of the test signal and aged signal. Taking aged written bits as a reference works well to detect extremely small changes in the recorded signal decay.

In order to measure SNR decay, the noise evolution is measured at the same time of detecting signal decay. A spectrum analyzer is implemented into the spin stand to measure the noise in frequency domain. Integrated noise can be obtained when a frequency sweep is performed. One can monitor this integrated noise as a function of time. Frequency sweep and noise integration is a long process and takes much more time than detecting the aged/test signal. The data-taking efficiency can be improved by properly selecting noise samples and constructing noise sensitivity to define integrated noise as a quantity for monitoring noise evolution.

Running the SNR decay module on a spin stand automatically provides signal decay and noise evolution at the same time. The decay rate can be evaluated by processing this collected data. The signal decay, noise increase, and SNR decay are a function of magnetic bit density. SNR decay is dominated by noise evolution at lower magnetic bit density. This result reveals one aspect of PMR that demagnetization at lower density creates significant noise background. The developed SNR decay module is a significant characterization tool as it impacts the PMR HDD product design, development, and manufacture. The developed SNR decay module can also be applied to current longitudinal magnetic recording. The measured SNR decay for one type of HDD media is well correlated with the HDD file data. This provides another example of the SNR decay module to be used for manufacture yield analysis.

The foregoing and other objects and advantages of the present invention will be apparent to those skilled in the art, in view of the following detailed description of the present invention, taken in conjunction with the appended claims and the accompanying drawings.

BRIEF DESCRIPTION OF THE DRAWINGS

So that the manner in which the features and advantages of the invention, as well as others which will become apparent are attained and can be understood in more detail, more particular description of the invention briefly summarized above may be had by reference to the embodiment thereof which is illustrated in the appended drawings, which drawings form a part of this specification. It is to be noted, however, that the drawings illustrate only an embodiment of the invention and therefore are not to be considered limiting of its scope as the invention may admit to other equally effective embodiments.

FIG. 4 depicts one embodiment of a graphical user interface showing the integration of SNR decay into one type of tester operation system and is constructed in accordance with the present invention;

FIG. 5 depicts one embodiment of a graphical user interface showing the SNR decay setup for a tester operation system and is constructed in accordance with the present invention;

DETAILED DESCRIPTION OF THE INVENTION

Perpendicular magnetic recording (PMR) is a promising technology for sustaining growth in data storage capacity. PMR employs a soft magnetic underlayer (SUL) and is potentially superior to longitudinal recording with respect to efficient writability and thermal stability of the written bits. An effective SUL is important for better writability and yet should not contribute significantly to the media noise. Unfortunately, most SUL materials are not only susceptible to stray fields causing random spike noise, but also deteriorate the recording performance.

The prior art may evaluate the signal decay in PMR systems, but is unable to address the noise evolution in PMR systems. It is desirable to have a magnetic test capability to detect signal decay and noise increment at the same time. In the present invention, a magnetic test module runs on a spin stand to detect amplitude decay and noise evolution at the same time so that signal-to-noise ratio (SNR) decay can be directly measured. The PMR recording performance, such as BER (bit error rate), is correlated better with SNR instead of signal only. The thermal stability of the PMR system is evaluated more accurately with this SNR decay method. Thus, in one embodiment, the present invention discloses a method of detecting SNR decay, while the prior art only detects signal decay.

Figure 1:
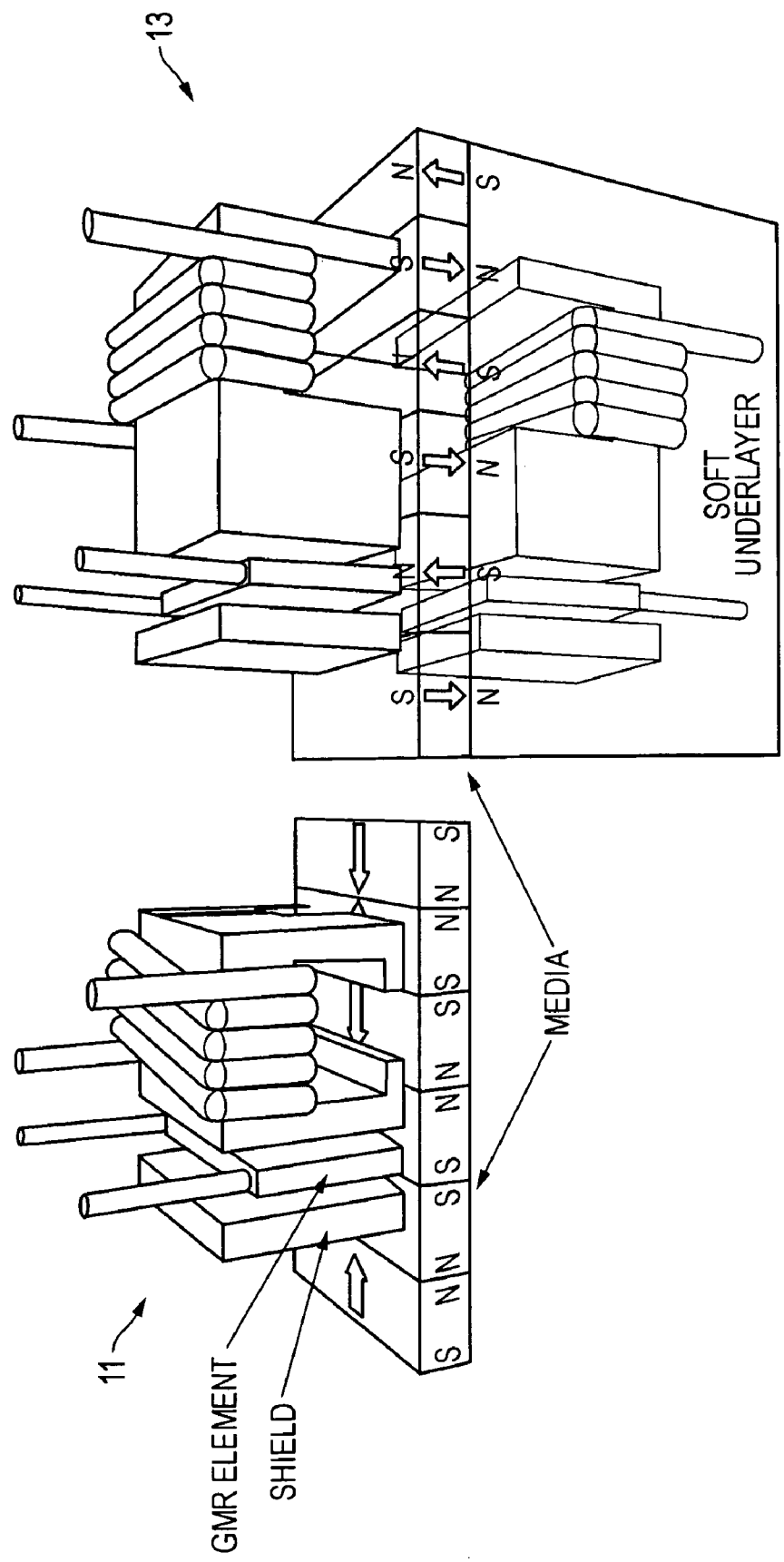
FIG. 1 is a schematic drawing of longitudinal and perpendicular recording architectures.
Figure 2:
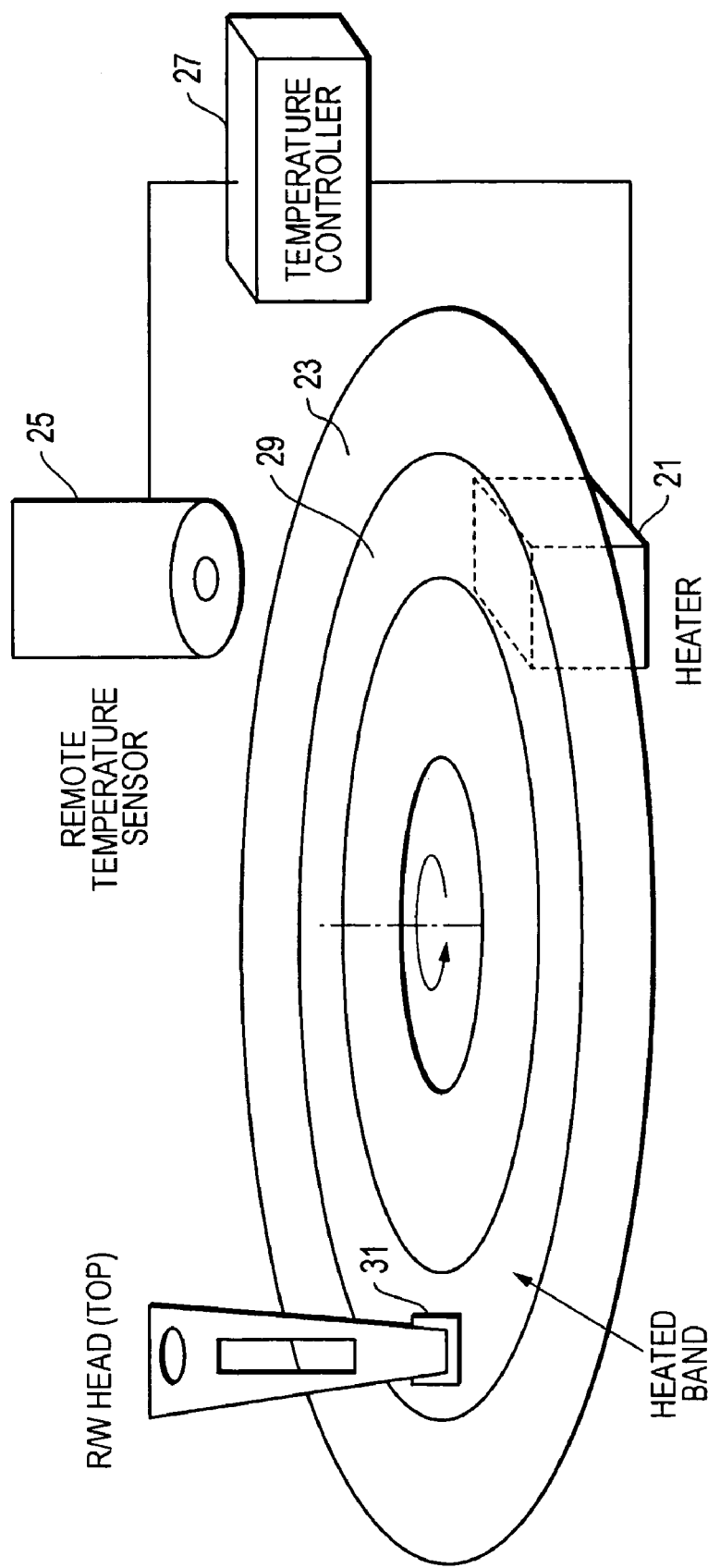
FIG. 2 is a schematic diagram of one embodiment of an SNR decay test setup constructed in accordance with the present invention.

The SNR decay is integrated into a spin stand for magnetic testing. One embodiment is depicted in FIG. 2, and includes a heater 21 located under the magnetic media disk 23, a remote sensing thermometer 25, and a temperature controller 27 that work as a subsystem to establish a desired environmental temperature for the disk 23. The heater 21 creates a heated band 29 in the disk 23 while the read/write head 31 flies above the heated band 29. The temperature control system may be removed when SNR decay measurement is performed under room temperature.

Figure 3:
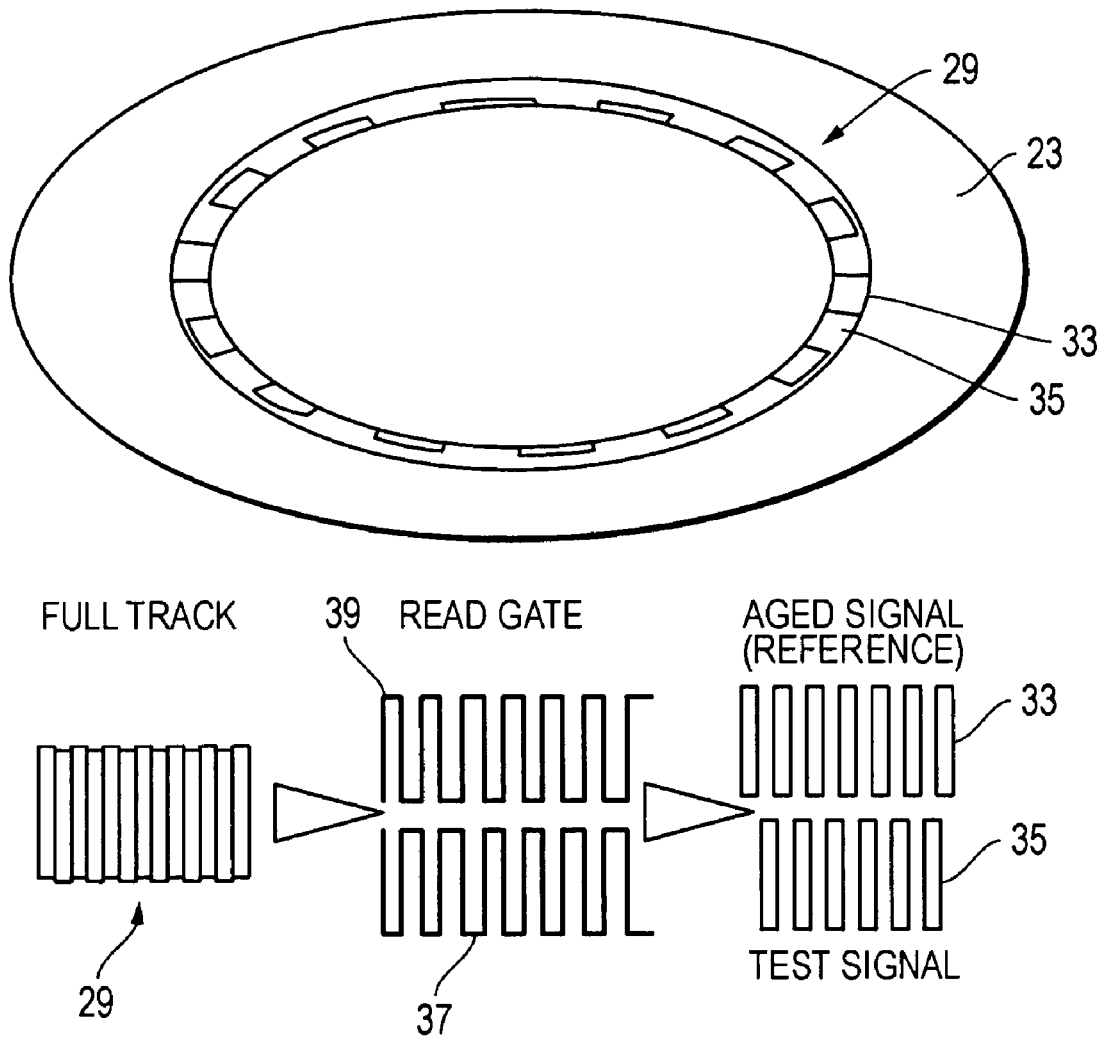
FIG. 3 is a schematic diagram of one embodiment of interleaved aged and test signals constructed in accordance with the present invention.

Media that may exhibit a significant amount of signal decay after several years of recording are not practically useful. The HDD product media that would exhibit little signal decay after several years of recording would likely exhibit almost negligible signal decay for a reasonably short period after recording. It poses a challenge to reliably measure extremely small changes of the recorded signals because of thermal drift (i.e., the head moves across the written track due to temperature changes in the environment over time) and sensitivity changes of the transducer (e.g., GMR or TMR sensor) of the recording head. To resolve this challenge, the aged signal 33 and test signal 35 are interleaved on the same written track 29 (FIG. 3). Write gate 37 and read gate 39 features are used to control the sequence of aged magnetic bits and test magnetic bits. The aged magnetic bit also acts as a reference signal to eliminate the adverse effects of thermal drift and sensitivity change mentioned above.

Figure 4:
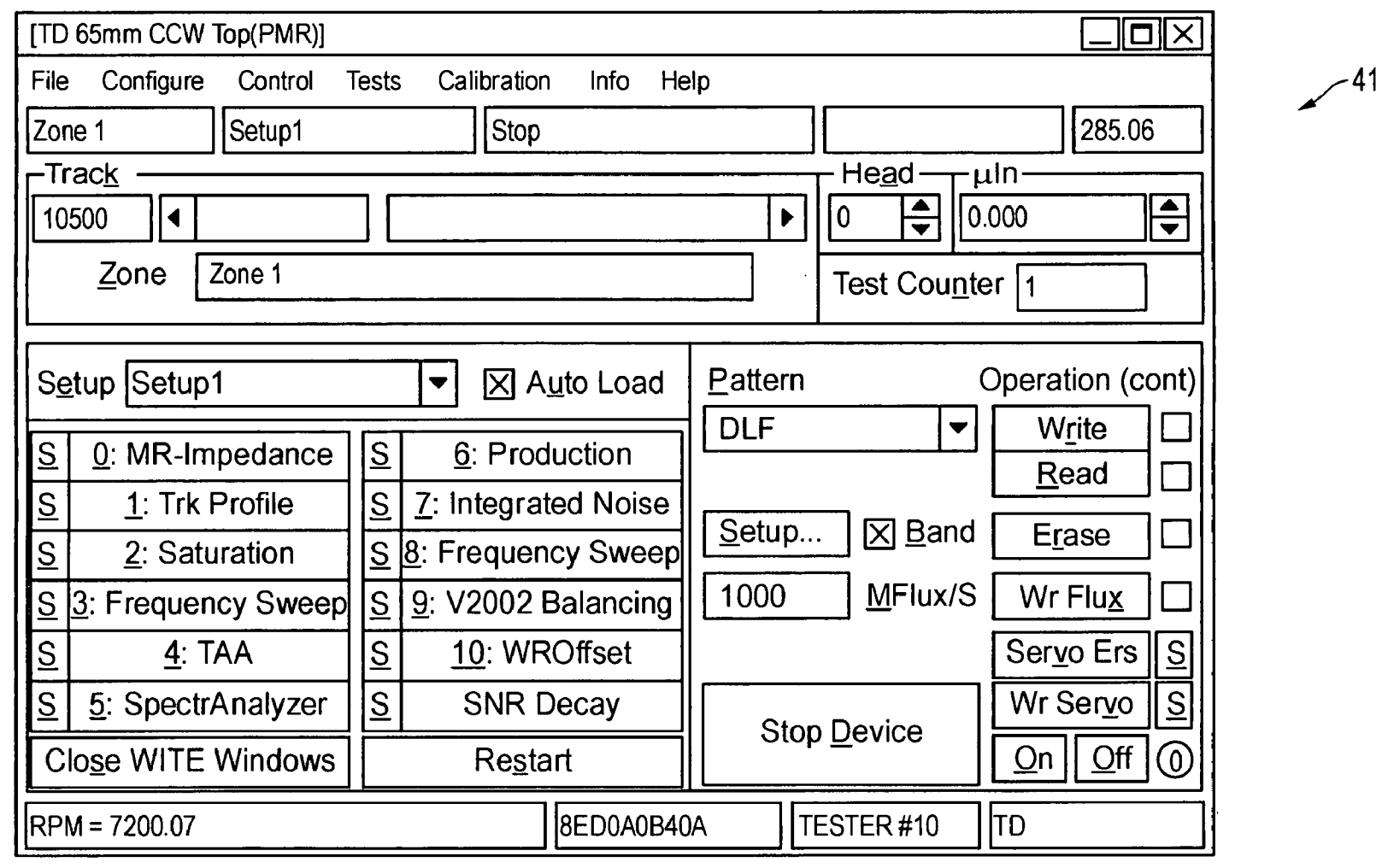

An SNR decay module was developed to operate decay measurement on a spin stand. For example, FIG. 4 shows a control panel for "SNR decay" that is integrated into the operation system 41 of one type of spin stand tester. The SNR decay module may be developed from computer code (i.e., source code) such as programming languages Visual Basic, C, C++, etc., and perform operations on a spin stand. The servo feature of the spin stand makes SNR decay measurement more accurate. Other functional buttons are listed for comparison or reference.

FIG. 5 is an example of an SNR decay setup screen 51, which reveals test conditions and parameters. The critical test parameters and test conditions may be integrated into this control panel so that an operator may perform it as a routine operation test for disk media.

In the device sector, one may specify spindle rotational speed, the location (e.g., track number and test radius) on the disk media to perform SNR decay measurement, skew angle of the read/write head, write current for the written transitions (e.g., aged and test bits), and the number of sectors for writing and servo control.

In the head disk information sector, one may input head identification for the specified SNR decay test. There is a selection to choose SNR decay measurement at room temperature or other specified temperatures to mimic HDD environments. Also, the specified disk identification can be logged.

In the spectrum and noise decay sector, one can specify the frequency range (e.g., data transfer rate) that is converted into a KFCI range reported in the summary area on the computer display. Other parameters, such as start time and end time, and the number of repeats (Nr of Repeat) are used to estimate the total test duration (e.g., in seconds) for SNR decay measurement. The SNR decay setup control panel provides a dynamic interface for an operator to easily perform the SNR decay test, which fits the disk media test in manufacturing.

In addition, it shows that SNR decay module can perform multi-density (e.g., KFCI or frequency) measurement at the same time, which largely enhances the test throughput and characterization efficiency. In the SNR decay module, a mechanism of separating aged signal and test signal is illustrated in terms of data processing.

Figure 6:
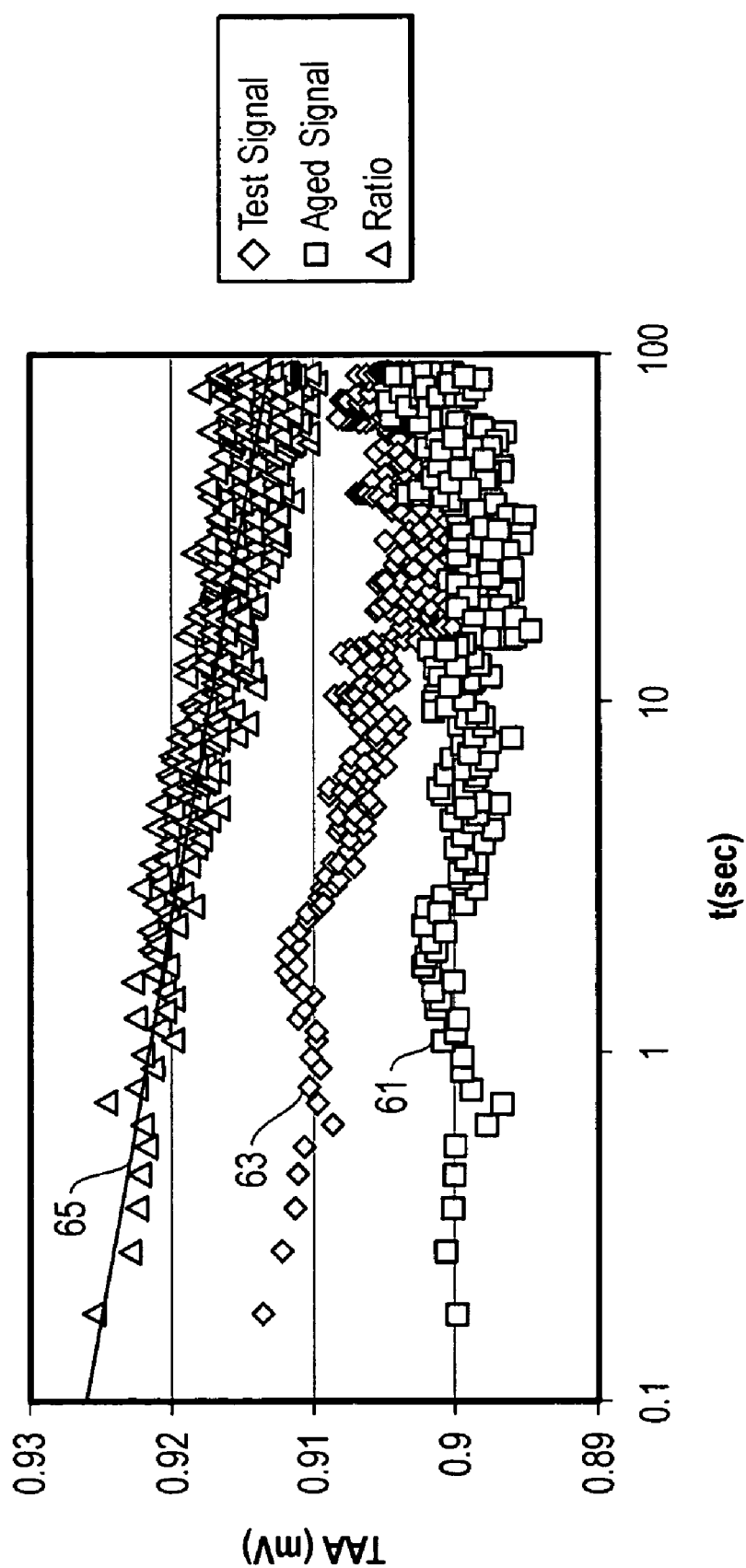
FIG. 6 is a plot of aged and test signals and a ratio thereof and is constructed in accordance with the present invention.

The measured aged signal 61 and test signal 63 fluctuate as a function of time, as shown in FIG. 6. This results from the combination of thermal drift and sensitivity change as discussed above. However, the ratio 65 of test signal 63 and aged signal 61 eliminates the fluctuation due to thermal drift and sensitivity change. Taking aged written bits as a reference works well to detect extremely small change of the recorded signal decay.

In order to measure SNR decay, the noise evolution is measured at the same time as detecting signal decay. A spectrum analyzer is implemented into the spin stand to measure the noise in frequency domain. Integrated noise can be obtained when frequency sweep may be performed with any industry standard spectrum analyzer. One can monitor this integrated noise as a function of time. Frequency sweep and noise integration is a long process and takes much more time than detecting the aged/test signal. The data-taking efficiency can be improved by properly selecting noise samples and constructing noise sensitivity to define integrated noise as a quantity for monitoring noise evolution.

Figure 7:
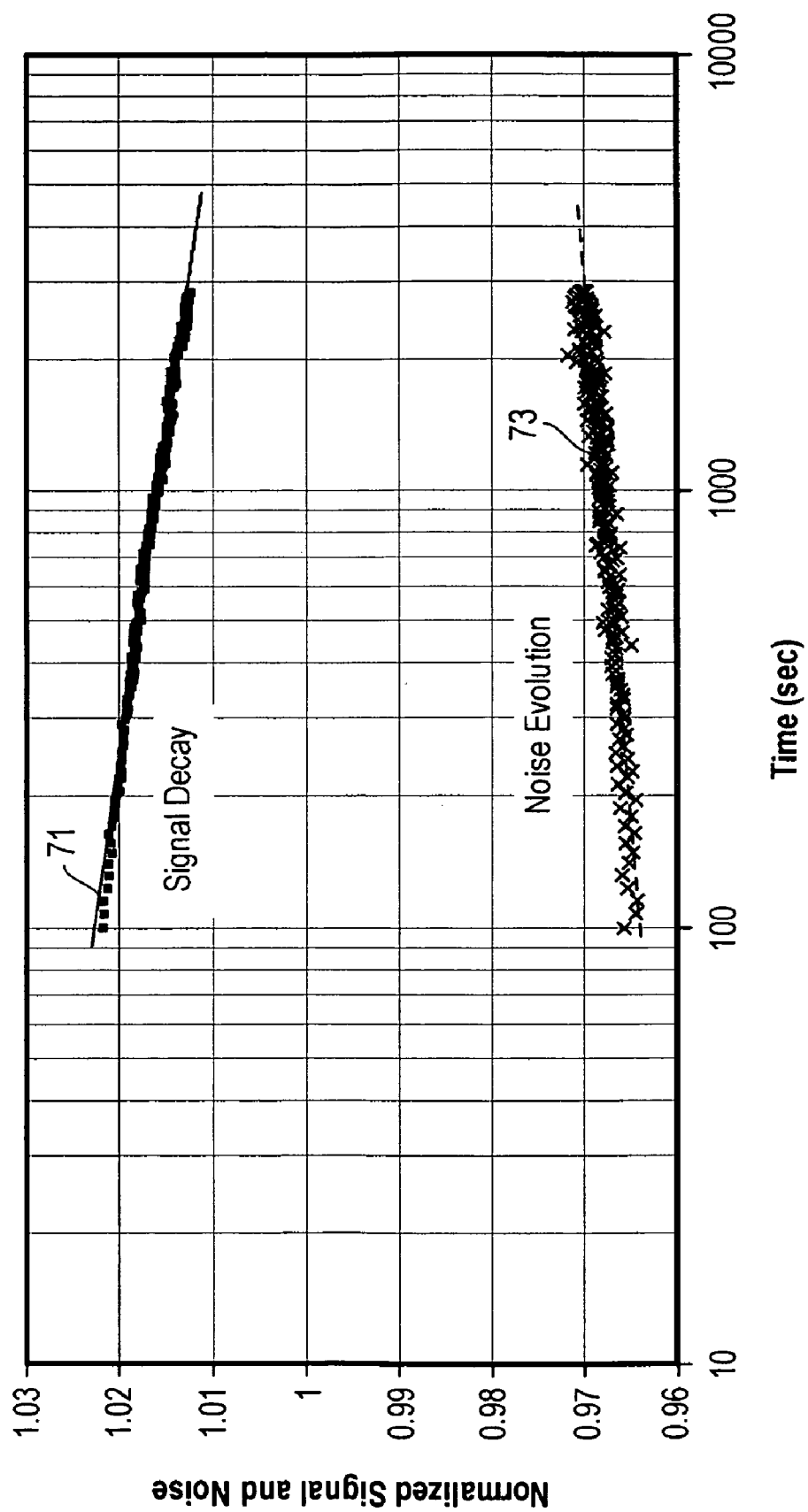
FIG. 7 is a plot of signal decay and noise evolution and is constructed in accordance with the present invention.
Figure 8:
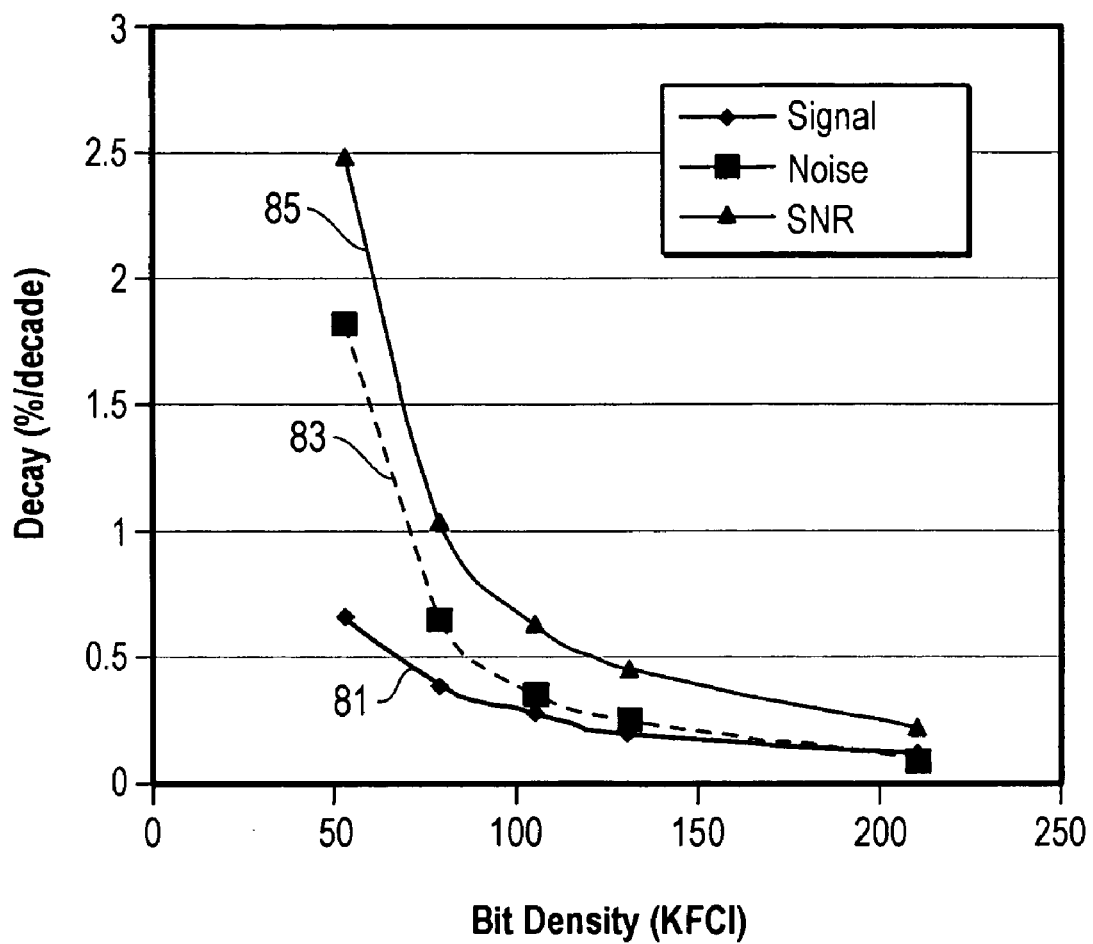
FIG. 8 is a plot of signal decay, noise increase, and SNR decay as a function of magnetic bit density and is constructed in accordance with the present invention.

Running the SNR decay module on a spin stand automatically provides signal decay 71 and noise evolution 73 at the same time, as plotted in FIG. 7. The decay rate (e.g., %/decade) can be evaluated by processing this collected data. The signal decay 81, noise increase 83, and SNR decay 85 are plotted in FIG. 8 as a function of magnetic bit density. SNR decay is dominated by noise evolution at lower magnetic bit density. This result reveals one aspect of PMR that demagnetization at lower density creates significant noise background. The developed SNR decay module is a significant characterization tool as it impacts the PMR HDD product design, development, and manufacture.

Figure 9:
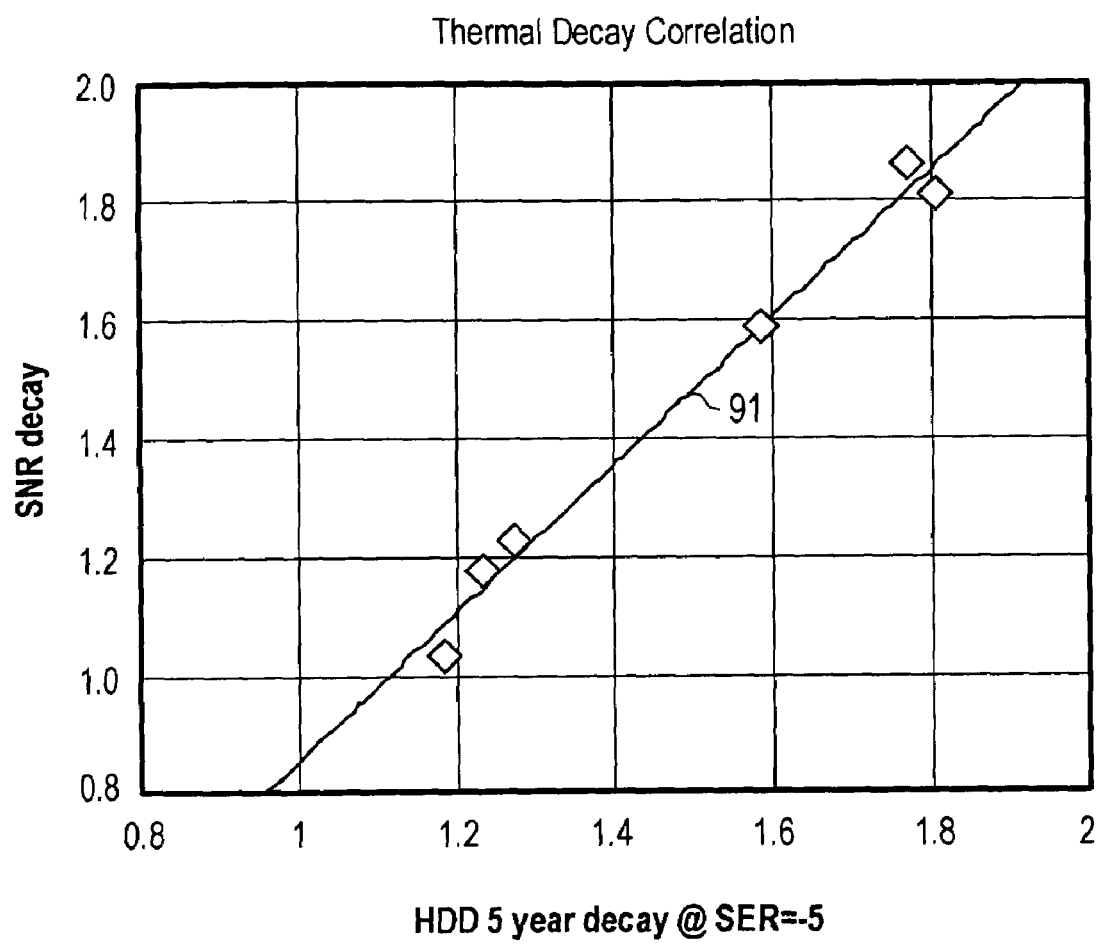
FIG. 9 is a plot of thermal decay correlation and is constructed in accordance with the present invention.

The developed SNR decay module can also be applied to current longitudinal magnetic recording. The measured SNR decay 91 for one type of HDD media is well correlated with the HDD file data, as shown in FIG. 9. This provides another example of the SNR decay module to be used for manufacture yield analysis.

The present invention also comprises a method of magnetic testing of disk drive on a spin stand. In one embodiment, the method comprises providing magnetic storage media; mounting the magnetic storage media to a spin stand; establishing a desired environmental temperature for the magnetic storage media; operating the magnetic storage media; and then detecting signal amplitude decay and noise evolution in the magnetic storage media at the same time to directly measure signal-to-noise ratio (SNR) decay in the disk drive over time. The magnetic storage media may utilize one of perpendicular magnetic recording (PMR) having a soft magnetic underlayer (SUL) and longitudinal magnetic recording (LMR).

The method may comprise positioning a heater, a remote sensing thermometer, and a temperature controller adjacent the magnetic storage media to establish the desired environmental temperature. The heater may be used to heat a radial swath of the magnetic storage media to form a heated band while a read/write head flies above the heated band, or the magnetic storage media may be operated at room temperature.

The method may further comprise interleaving an aged signal and a test signal on a same written track on the magnetic storage media, and using write gate and read gate features to control a sequence of aged magnetic bits and test magnetic bits, wherein the aged magnetic bits act as a reference signal to eliminate adverse effects of thermal drift and sensitivity change, and wherein the aged signal and the test signal fluctuate as a function of time. The SNR decay module may perform multi-density measurement including KFCI and frequency measurement at the same time to enhance test throughput and characterization efficiency.

In addition, the method may further comprise implementing a spectrum analyzer into the spin stand to measure noise in frequency domain, and obtaining integrated noise when frequency sweep is performed with a spectrum analyzer as a function of time, and/or improving a data-taking efficiency by properly selecting noise samples and constructing noise sensitivity to define integrated noise as a quantity for monitoring noise evolution.

The present invention has several advantages, including the ability to detect the SNR (signal-to-noise) decay while the prior art only can measure the signal decay. This solution includes a new measurement algorithm and magnetic test methodology that detects SNR decay in PMR systems. The present invention includes unique features and technical merits in terms of measurement algorithm, easy implementation, wide adoptability by spin stand test equipment companies and the HDD industry in general. It directly monitors signal decay and noise evolution in a proper time domain, which detects SNR decay in PMR systems.

While the invention has been shown or described in only some of its forms, it should be apparent to those skilled in the art that it is not so limited, but is susceptible to various changes without departing from the scope of the invention.

What is claimed is:

1. A method of magnetic testing of disk drive on a spin stand, the method comprising:
   (a) providing magnetic storage media;
   (b) mounting the magnetic storage media to a spin stand;
   (c) establishing a desired environmental temperature for the magnetic storage media;
   (d) operating the magnetic storage media; and
   (e) detecting signal amplitude decay and noise evolution in the magnetic storage media at the same time to directly measure signal-to-noise ratio (SNR) decay in the disk drive over time.

2. A method according to claim 1, wherein the magnetic storage media utilizes one of perpendicular magnetic recording (PMR) having a soft magnetic underlayer (SUL) and longitudinal magnetic recording (LMR).

3. A method according to claim 1, wherein step (c) comprises positioning a heater, a remote sensing thermometer, and a temperature controller adjacent the magnetic storage media to establish the desired environmental temperature.

4. A method according to claim 3, wherein the heater heats a radial swath of the magnetic storage media to form a heated band while a read/write head flies above the heated band.

5. A method according to claim 1, wherein step (c) comprises operating the magnetic storage media at room temperature.

6. A method according to claim 1, further comprising interleaving an aged signal and a test signal on a same written track on the magnetic storage media, and using write gate and read gate features to control a sequence of aged magnetic bits and test magnetic bits.

7. A method according to claim 6, wherein the aged magnetic bits act as a reference signal to eliminate adverse effects of thermal drift and sensitivity change.

8. A method according to claim 1, wherein the SNR decay module performs multi-density measurement including KFCI and frequency measurement at the same time to enhance test throughput and characterization efficiency.

9. A method according to claim 1, further comprising implementing a spectrum analyzer into the spin stand to measure noise in frequency domain, and obtaining integrated noise when frequency sweep is performed with a spectrum analyzer as a function of time.

10. A method according to claim 1, further comprising improving a data-taking efficiency by properly selecting noise samples and constructing noise sensitivity to define integrated noise as a quantity for monitoring noise evolution.

11. A method of magnetic testing of disk drive on a spin stand, the method comprising:
   (a) providing magnetic storage media;
   (b) mounting the magnetic storage media to a spin stand;
   (c) establishing a desired environmental temperature for the magnetic storage media by positioning a heater, a remote sensing thermometer, and a temperature controller adjacent the magnetic storage media to establish the desired environmental temperature;
   (d) operating the magnetic storage media;
   (e) detecting signal amplitude decay and noise evolution in the magnetic storage media at the same time to directly measure signal-to-noise ratio (SNR) decay in the disk drive over time; and
   (f) interleaving an aged signal and a test signal on a same written track on the magnetic storage media, and using write gate and read gate features to control a sequence of aged magnetic bits and test magnetic bits, such that the aged magnetic bits act as a reference signal to eliminate adverse effects of thermal drift and sensitivity change.

12. A method according to claim 11, wherein the magnetic storage media utilizes one of perpendicular magnetic recording (PMR) having a soft magnetic underlayer (SUL) and longitudinal magnetic recording (LMR).

13. A method according to claim 11, wherein the heater heats a radial swath of the magnetic storage media to form a heated band while a read/write head flies above the heated band.

14. A method according to claim 11, wherein step (c) comprises operating the magnetic storage media at room temperature.

15. A method according to claim 11, wherein the SNR decay module performs multi-density measurement including KFCI and frequency measurement at the same time to enhance test throughput and characterization efficiency.

16. A method according to claim 11, further comprising implementing a spectrum analyzer into the spin stand to measure noise in frequency domain, and obtaining integrated noise when frequency sweep is performed with a spectrum analyzer as a function of time.

17. A method according to claim 11, further comprising improving a data-taking efficiency by properly selecting noise samples and constructing noise sensitivity to define integrated noise as a quantity for monitoring noise evolution.

* * * * *